(12) United States Patent
Carbonell Maté et al.

(10) Patent No.: US 10,136,522 B2
(45) Date of Patent: Nov. 20, 2018

(54) ELECTRICAL TERMINAL AND CIRCUIT BOARD ASSEMBLY CONTAINING THE SAME

(71) Applicant: LEAR CORPORATION, Southfield, MI (US)

(72) Inventors: Xavier Carbonell Maté, Valls (ES); Gerard Vall Gendre, Valls (ES); Ramón Piñana López, Valls (ES)

(73) Assignee: Lear Corporation, Southfield, MI (US)

( * ) Notice: Subject to any disclaimer, the term of this patent is extended or adjusted under 35 U.S.C. 154(b) by 404 days.

(21) Appl. No.: 14/708,941

(22) Filed: May 11, 2015

(65) Prior Publication Data
US 2016/0336670 A1 Nov. 17, 2016

(51) Int. Cl.
| | |
|---|---|
| *H05K 7/00* | (2006.01) |
| *H05K 3/32* | (2006.01) |
| *H01R 12/71* | (2011.01) |
| *H01R 13/11* | (2006.01) |
| *H01R 12/58* | (2011.01) |
| *H01R 12/70* | (2011.01) |
| *H01R 101/00* | (2006.01) |

(52) U.S. Cl.
CPC ............. *H05K 3/32* (2013.01); *H01R 12/718* (2013.01); *H01R 13/113* (2013.01); *H01R 12/58* (2013.01); *H01R 12/7088* (2013.01); *H01R 2101/00* (2013.01)

(58) Field of Classification Search
USPC .................................. 361/760, 631, 761, 630
See application file for complete search history.

(56) References Cited

U.S. PATENT DOCUMENTS

| | | | |
|---|---|---|---|
| 3,396,313 A | 8/1968 | Payne | |
| 3,523,268 A | 8/1970 | Foster | |
| 4,682,838 A * | 7/1987 | Achtnig | ................. H01R 13/26 439/357 |
| 7,112,071 B2 | 9/2006 | Nakagawa et al. | |
| 8,446,733 B2 | 5/2013 | Hampo et al. | |
| 2003/0143876 A1 | 7/2003 | Middlehurst et al. | |
| 2007/0263344 A1* | 11/2007 | Kriegesmann | ....... H01H 85/044 361/630 |
| 2014/0198467 A1 | 7/2014 | Shi | |

FOREIGN PATENT DOCUMENTS

| | | |
|---|---|---|
| CN | 2266204 | 10/1997 |
| CN | 201590528 | 9/2010 |

* cited by examiner

*Primary Examiner* — Andargie M Aychillhum
(74) *Attorney, Agent, or Firm* — Fishman Stewart PLLC (57) ABSTRACT

The present disclosure includes a circuit board assembly that may include a circuit board that may include a first side and a second side opposite from the first side. The circuit board assembly may include a female terminal inserted in the first side of the circuit board and an electrical component that may be disposed at the second side. The first electrical component may include a first male terminal extending through the circuit board into the first female terminal. A female electrical terminal may include an outer wall defining an internal space and a pair of prongs extending from the outer wall and at least partially within the internal space. The pair of prongs may be disposed at a vertical distance from the top of the outer wall.

20 Claims, 10 Drawing Sheets

ELECTRICAL TERMINAL AND CIRCUIT BOARD ASSEMBLY CONTAINING THE SAME

TECHNICAL FIELD

The present disclosure relates to electrical components, including electrical connectors and/or electrical terminals.

BACKGROUND

Conventional female terminals may be configured such that they increase the overall height of a circuit board or of a power distribution box, which may not be desirable. Conventional terminals may not compatible with certain welding techniques, such as, for example, reflow soldering.

SUMMARY

The present disclosure includes a method of assembling a circuit board assembly that includes providing a circuit board. The circuit board may include a first side and a second side opposite the first side. The method may include inserting a female terminal into the first side of the circuit board and/or inserting an electrical component into the second side of the circuit board such that a male terminal of the electrical component extends through the circuit board and into the female terminal.

In embodiments, a circuit board assembly may comprise a circuit board that includes a first side and a second side opposite from the first side. A circuit board assembly may include a female terminal inserted in the first side of the circuit board and/or an electrical component disposed at the second side. In embodiments, the first electrical component may include a first male terminal that extends through the circuit board into the first female terminal.

DETAILED DESCRIPTION

Reference will now be made in detail to embodiments of the present disclosure, examples of which are described herein and illustrated in the accompanying drawings. While the disclosure will be described in conjunction with embodiments and/or examples, it will be understood that they are not intended to limit the present disclosure to these embodiments and/or examples. On the contrary, the present disclosure is intended to cover alternatives, modifications and equivalents, which may be included within the spirit and scope of the present disclosure.

In embodiments, a circuit board assembly 10 may include a circuit board 20, a female electrical terminal 30, a second female electrical terminal 30', a support structure/housing 90, electrical components 100, 102, and/or a connector 110. In embodiments, circuit board 20 may comprise a printed circuit board (PCB). In embodiments, a terminal may include one or more of a variety of articles configured for providing an electrical and/or physical connection.

Figure 1:
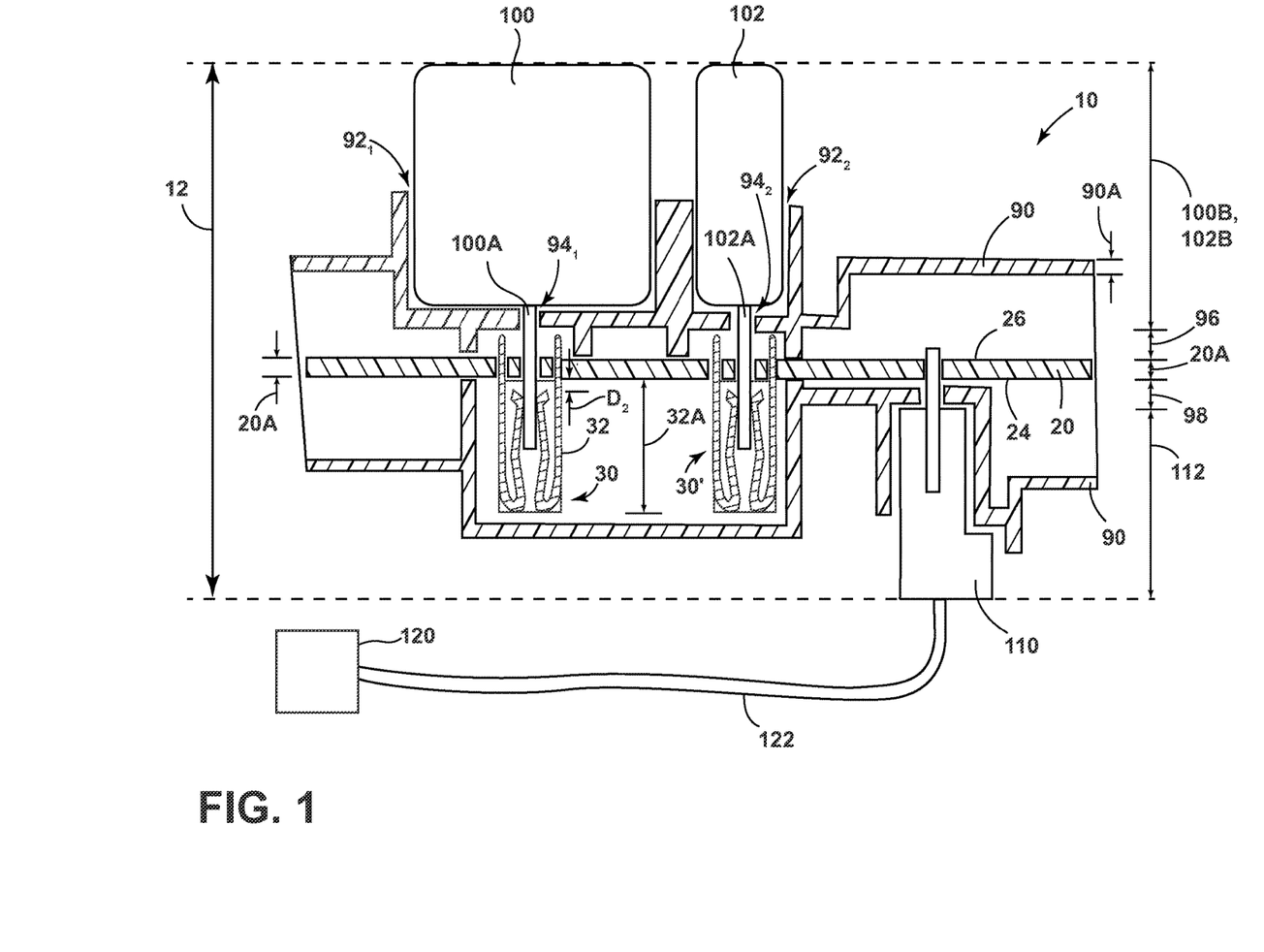
FIG. 1 is a cross-sectional side view of an embodiment of a circuit board assembly in accordance with teachings of the present disclosure.

In embodiments, such as generally illustrated in FIG. 1, a female terminal 30 may be configured to receive a male terminal 100A of an electrical component 100, which may include physically retaining the male terminal 100A relative to circuit board 20 and/or providing an electrical connection between male terminal 100A and circuit board 20. For example, and without limitation, female terminals 30, 30' may be configured to receive male terminals 100A, 102A of electrical components 100, 102, respectively. Female terminal 30 will be described in detail below, but female terminal 30' may include the same or similar features as female terminal 30.

In embodiments, such as generally illustrated in FIGS. 2A-3D, female terminal 30 may include an outer wall 32, one or more prongs 60, 62, 64, 66, and/or one or more protrusions/legs 80, 82, 84, 86. Outer wall 32 may include one or more of a variety of shapes, sizes, and/or configurations. For example, and without limitation, outer wall 32 may include a generally rectangular shape that may include a first set of generally parallel wall sections (e.g., sections 34, 36) that may be disposed opposite each other and/or a second set of generally parallel wall sections (e.g., sections 38, 40) that may be disposed opposite each other and generally perpendicular to the first set of wall sections. In embodiments, outer wall 32 may be continuous (e.g., wall sections 34, 36, 38, 40 may form a continuous loop).

In embodiments, such as generally illustrated in FIGS. 3A-3D in connection with female terminal 30, two or more of the wall sections may be engaged with each other via corresponding protrusions and recesses, which may correspond to outer wall 32 being an interlocking wall. For example, and without limitation, first wall section 34 of female terminal 30 may include protrusions 34B, 34C that may engage recesses 40B, 40C of fourth wall section 40. In embodiments, protrusions (e.g., 34B, 34C) and/or recesses (e.g., 40B, 40C) may extend laterally (e.g., generally horizontal and/or parallel to circuit board 20). In embodiments, a plurality of female terminals 30 may be manufactured in a reel and/or assembling female terminals 30 may include engaging protrusions (e.g., 34B, 34C) with recesses (40B, 40C).

In embodiments, bottom 46 of outer wall 32 may include one or more vertical extensions 50A, 50B that may extend away downwardly (e.g., away from top 44 of outer wall 32). For example, and without limitation, extension 50A may extend from a first outer wall section 34 of terminal 30 and/or extension 50B may extend from a third outer wall section 38 of terminal 30. Vertical extensions 50A, 50B may include heights that may generally correspond to the height of curved portions 60A, 62A, 64A, 66A of prongs 60, 62, 64, 66 (described below).

In embodiments, outer wall 32 may include a height 32A that may or may not be constant. Upon insertion, a top 44 of outer wall 32 may be configured to be disposed adjacent to circuit board 20 (e.g., bottom side 24 of circuit board 20) and/or a bottom 46 of outer wall 32 may face away from circuit board 20. In embodiments, outer wall 32 may define an internal space 48 (e.g., a cavity, a chamber, etc.).

In embodiments, a female terminal 30 may include one or more prongs (e.g., prongs 60, 62, 64, 66). In embodiments, prong 60 may include a first portion 60A, a second portion 60B, and/or a width 60C. In embodiments, first portion 60A, which may be referred to herein as curved portion 60A, may extend from outer wall (e.g., from bottom 46 of outer wall 32). Curved portion 60A may initially extend generally away from circuit board 20 and/or may then curve about 180 degrees to extend generally toward circuit board 20. In embodiments, prong 60 may extend from outer wall 32, but may not otherwise contact outer wall 32.

Figure 2A:
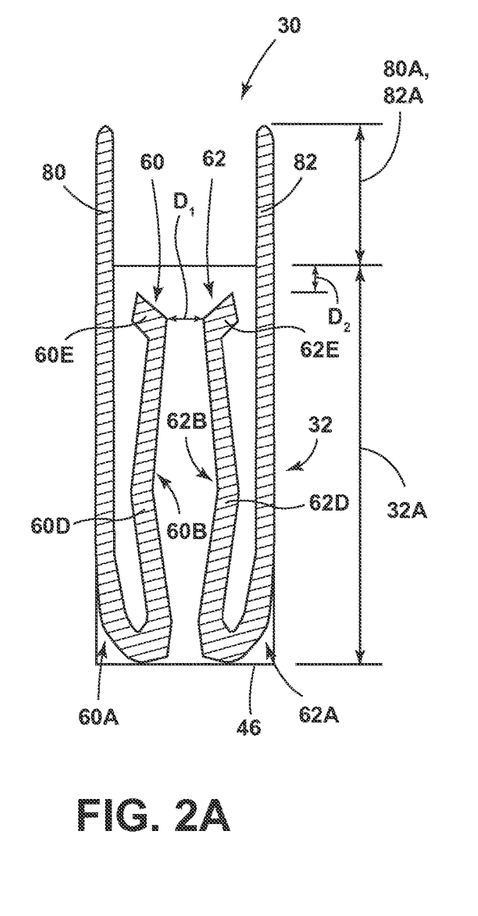
FIG. 2A is a cross-sectional view of an embodiments of a female terminal in accordance with teachings of the present disclosure.
Figure 2B:
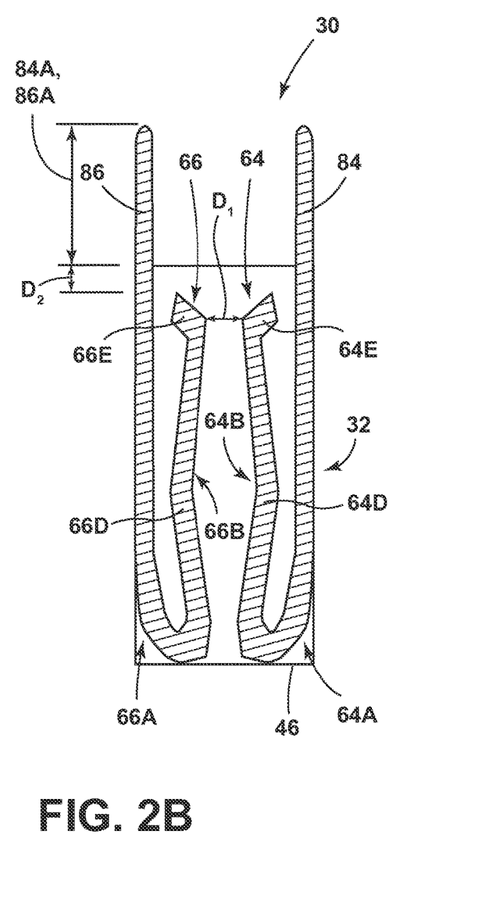
FIG. 2B is a cross-sectional view of the embodiment of a female terminal of FIG. 2A viewed from the opposite side.
Figure 2C:
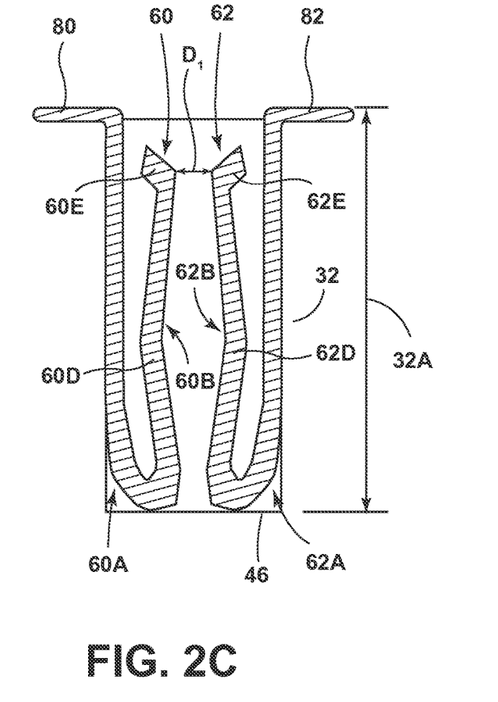
FIG. 2C is a cross-sectional view of an embodiments of a female terminal in accordance with teachings of the present disclosure.
Figure 2D:
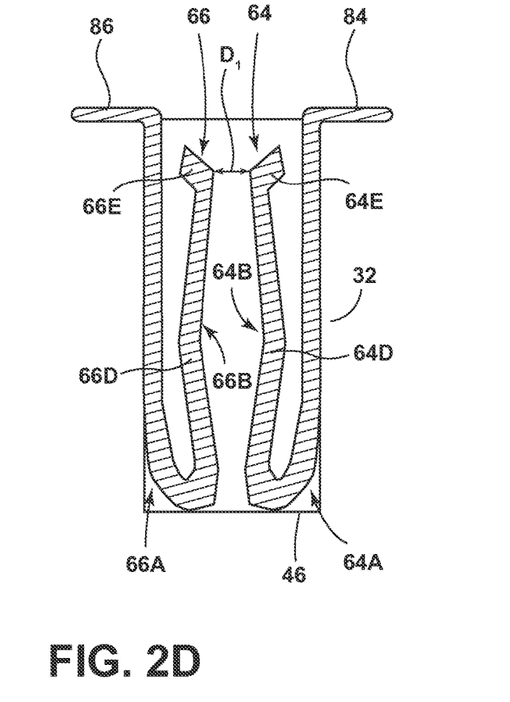
FIG. 2D is a cross-sectional view of the embodiment of a female terminal of FIG. 2C viewed from the opposite side.

In embodiments, second portion 60B may then extend from the end of first portion 60A such that second portion 60B may be disposed partially and/or entirely within internal space 48. Second portion 60B may extend generally toward circuit board 20. In embodiments, second portion 60B may include one or more bends and/or angled portions. For example, such as generally illustrated in FIG. 2A, prong 60 may include a bent portion 60D that may bend outward toward outer wall 32 and/or may be disposed generally in the middle of second portion 64B. Additionally or alternatively, second portion 60B may include a bent end 60E that may form angle of about 90 degrees relative to an adjacent section of second portion 60B. For example, and without limitation, second portion 64B may include a shape that generally resembles an M and/or a W.

In embodiments, prongs 60, 62 may be separated (e.g., horizontally) by a distance $D_1$. In embodiments, $D_1$ may be constant. In other embodiments, $D_1$ may vary along the length of prongs 60, 62. For example, and without limitation, $D_1$ may be relatively small near bottom 46 and/or near ends 60E, 62E, may increase at or near bent portions 60D, 62D, and/or may be largest at or near bent portions 60D, 62D. For example, and without limitation, a minimum of distance $D_1$ may be about 0.4 mm, which may be configured to accommodate male terminals (e.g., male terminals 100A, 102A) that may include thickness of about 0.6 mm to 1.2 mm. In embodiments, D1 may be larger or smaller to accommodate larger or smaller male terminals. In embodiments, ends of prongs 60, 62 (e.g., bent ends 60E, 62E) may be disposed at a distance $D_2$ (e.g., vertically offset) from the top 44 of outer wall 32 (e.g., the length 32A of outer wall 32 may be greater than the length of prongs 60, 62). Disposing ends (e.g., ends 60E, 62E) of prongs 60, 62 at a distance $D_2$ from the top 44 of outer wall 32 may allow for prongs 60, 62 to be separated from and/or not in contact with a circuit board upon full insertion of terminal 30 into a circuit board (e.g., prongs 60, 62 may be separated by distance $D_2$ from circuit board 20 with the top 44 of outer wall 32 adjacent to circuit board 20). For example, and without limitation, $D_2$ may be 0.7 mm or greater.

While potential features of embodiments of prong 60 have been discussed in detail, in embodiments, other prongs may include a similar or the same configuration as prong 60. For example, and without limitation, prongs 62, 64, 66 of terminal 30 may also include respective curved portions (e.g., 62B, 64B, 66B), respective widths (e.g., 62C, 64C, 66C), and/or respective second portions (e.g., 62B, 64B, 66B). Second portions 62B, 64B, 66B may include respective bent portions 62D, 64D, 66D and/or respective bent ends 62E, 64E, 66E.

Figure 3A:
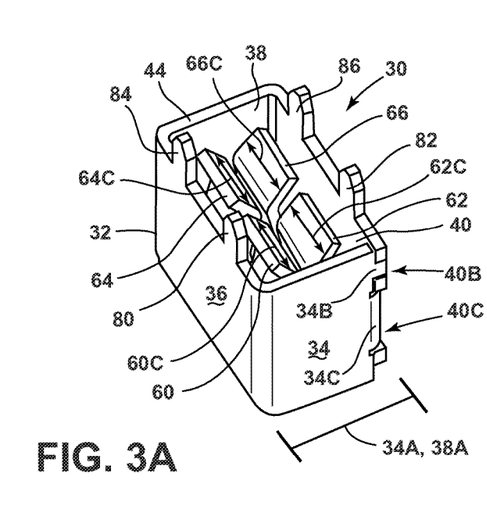
FIGS. 3A-3D are various perspective views of an embodiment of an inverted female terminal in accordance with teachings of the present disclosure.
Figure 3B:
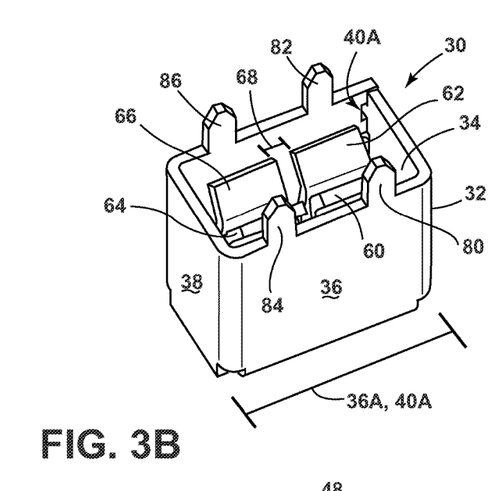
Figure 3C:
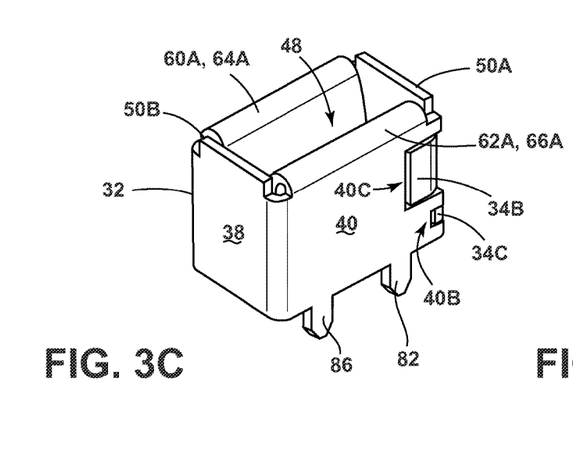
Figure 3D:
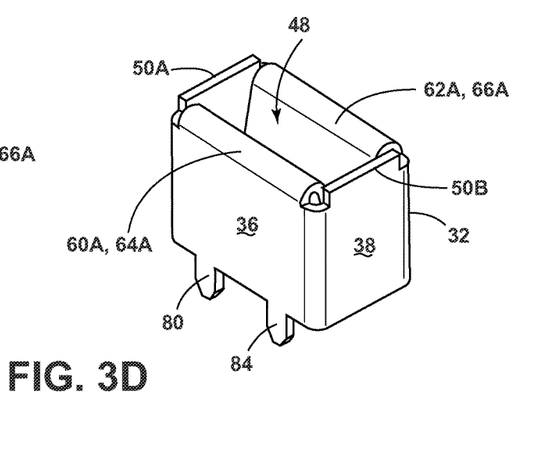

In embodiments, prongs (e.g., prongs 60, 62) may be configured to receive a male terminal of an electrical component, such as male terminal 100A of electrical component 100. In embodiments, bent ends of opposing prongs (e.g., bent ends 60E, 62E of prongs 60, 62) may form a shape that generally resembles a V that may open toward circuit board 20 and/or may be configured to receive a male terminal 100A of an electrical component 100. In embodiments, prongs may be provided in pairs. For example, and without limitation, a first pair of prongs 60, 62 may be disposed opposite each other and/or may extend from opposite wall sections of outer wall (e.g., from sections 36, 40, respectively). Prongs 60, 62 may be biased generally toward each other and/or may be relatively resistant to movement toward the wall section from which they extend (e.g., prong 60 may be resistant to movement toward second wall section 36). A biasing force and/or resistance to movement provided by prongs 60, 62 may be configured to retain male terminal 100A once the male terminal 100A has been inserted into a female terminal 30 (e.g., between prongs 60 and 62). In embodiments, female terminal 30 may include a second pair of prongs 64, 66 that may be disposed opposite each other and/or may be disposed next to the first pair of prongs 60, 62. The first and second pair of prongs may be generally aligned and/or may be separated by a distance 68. A separation distance 68 may be relatively small, which may include, for example, being less than the width 62C of prong 62 and/or width 66C of prong 66. In embodiments, the first and second sets of prongs may cooperate to retain a male terminal 100A relative to circuit board 20, which may provide a greater biasing force than just one set of prongs. In embodiments, such as generally illustrated in FIGS. 3C and 3D, curved portions of certain prongs (e.g., curved portions 60A, 64A of prongs 60, 64 and/or curved portions 62A, 66A of prongs 62, 66) may be formed as a single piece. In such configurations, separation distance 68 may exist between respective second portions 60B, 64B and/or second portions 62B, 66B, but not between the curved portions 60A, 62A and/or curved portions 62A, 66A.

Figure 5A:
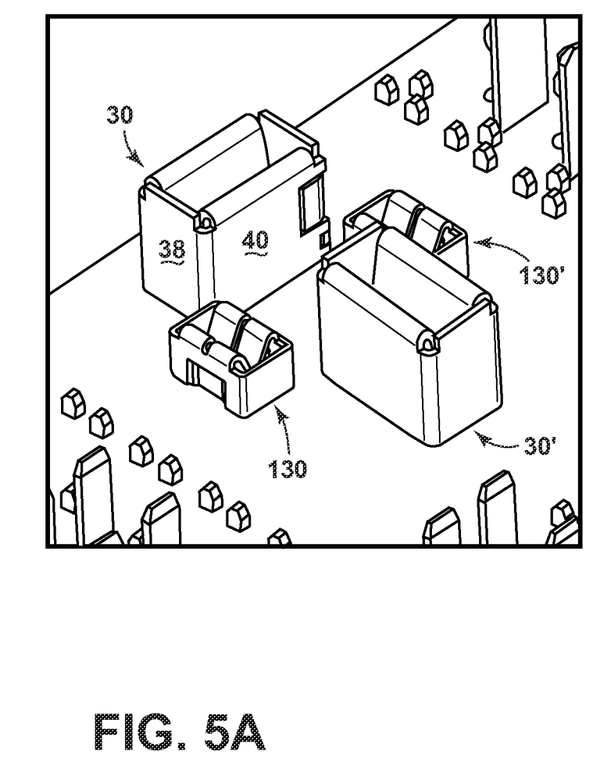
FIGS. 5A and 5B are perspective views of embodiments of a circuit board assembly including inverted female terminals in accordance with teachings of the present disclosure.
Figure 5B:
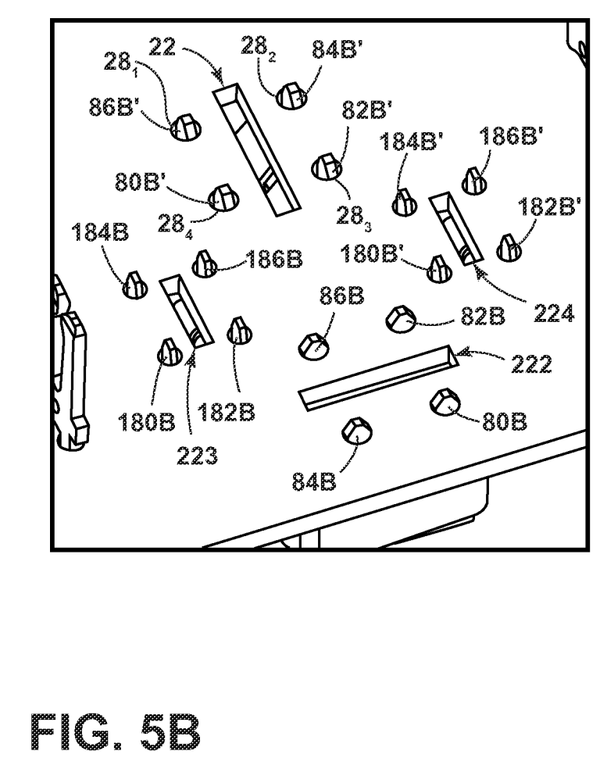

In embodiments, such as generally illustrated in FIGS. 1-3D, a female terminal 30 may include one or more protrusions that may be configured for connecting female terminal 30 to circuit board 20. In embodiments, two protrusions 80, 82 may extend from the top 44 of outer wall 32 at second section 36 and/or two protrusions 84, 86 may extend from the top 44 of outer wall 32 at fourth outer wall section 40. In embodiments, such as generally illustrated in FIGS. 2A and 2B, one or more of protrusions 80, 82, 84, 86 may extend generally vertically from outer wall 32 (e.g., may be generally parallel to outer wall 32 and/or a direction of insertion). In other embodiments, such as generally illustrated in FIGS. 2C and 2D, one or more of protrusions 80, 82, 84, 86 may extend generally horizontally from outer wall 32 (e.g., may be generally perpendicular to outer wall 32 and/or generally parallel to circuit board 20). In embodiments, such as generally illustrated in FIG. 5B, the lengths 80A, 82A, 84A, 86A of protrusions 80, 82, 84, 86, which may or may not be the same, may be longer than the thickness 20A of circuit board 20. In such configuration, upon insertion, the protrusions 80, 82, 84, 86 may extend into first side 24 of circuit board 20 and beyond second side 26 of circuit board 20. For example, and without limitation, protrusions 80, 82, 84, 86 of female terminal 30 may extend into first side 24 of circuit board 20 and beyond second side 26 of circuit board 20 such that portions 80B, 82B, 84B, 86B extend beyond second side 26. Additionally or alternatively, portions 80B', 82B', 84B', 86B' of protrusions of terminal 30' may extend beyond second side 26 of circuit board 20. In embodiments, portions 80B, 82B, 84B, 86B of protrusions 80, 82, 84, 86 that may extend beyond second side 26 of circuit board 20 may be permanently fixed to circuit board 20, such as via soldering. Female terminals 30 may be compatible with one or more soldering techniques, such as wave soldering, selective-wave soldering, and/or reflow soldering.

Figure 4A:
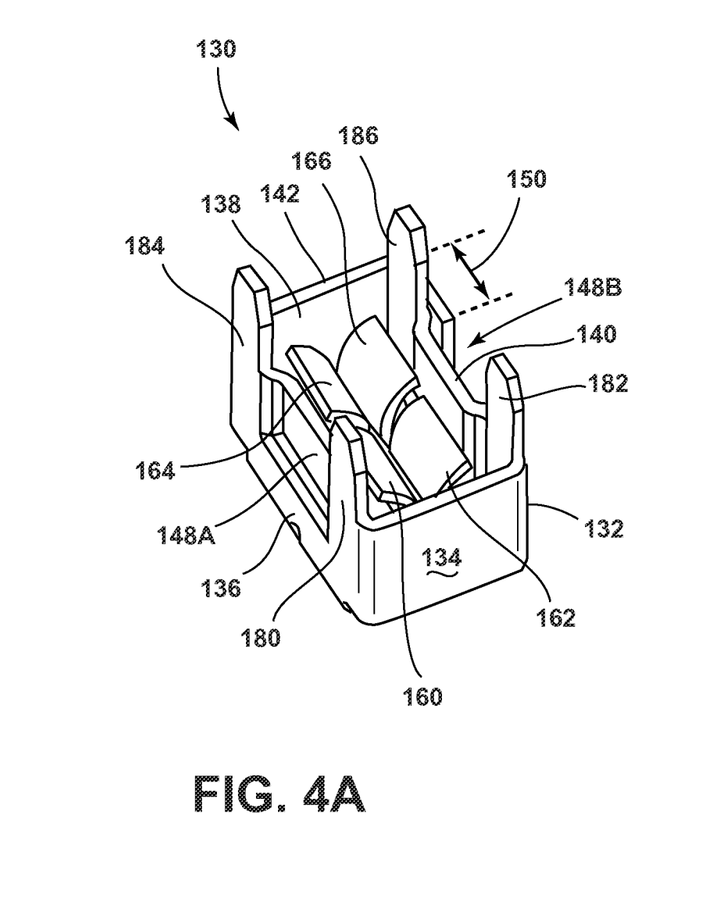
FIGS. 4A and 4B are perspective views of another embodiment of an inverted female terminal in accordance with teachings of the present disclosure
Figure 4B:
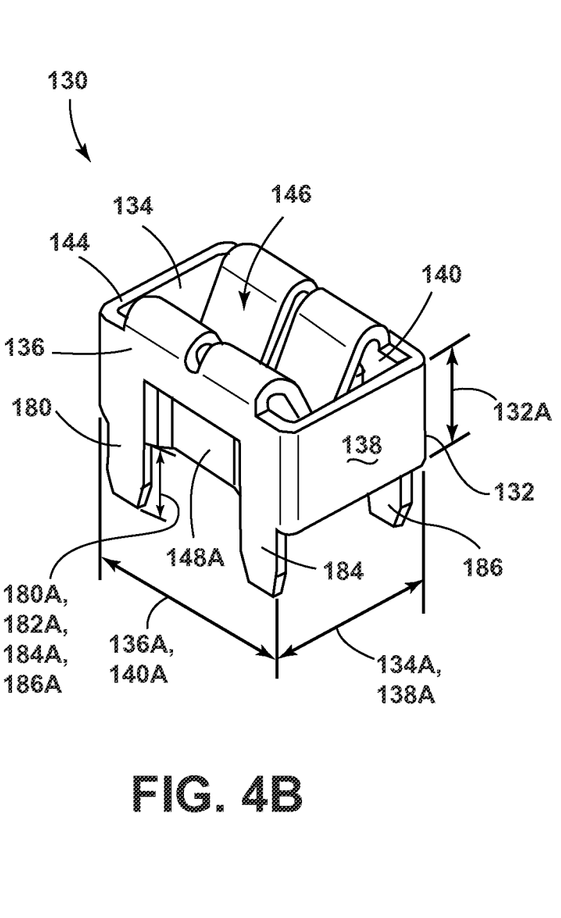

In embodiments, such as generally illustrated in FIGS. 4A and 4B, a female terminal (e.g., female terminal 130) may include a relatively short outer wall 132 (e.g., shorter than outer wall 32 of terminal 30). Outer wall may include a first outer wall section 134, a second outer wall section 136, a third outer wall section 138, a fourth outer wall section 140, a top 142, a bottom 144, and/or may define an internal space 146. In embodiments, female terminal 130 may include prongs 160, 162, 164, 166 that may be configured similar to and/or the same as prongs 60, 62, 64, 66 of terminal 30. In other embodiments, one or more of prongs 160, 162, 164, 166 may generally curve outwardly toward the top 142 of outer wall 132. In embodiments, female terminal 130 may include protrusions 180, 182, 184, 186 that may be configured similar to and/or the same as protrusions 80, 82, 84, 86 of terminal 30. Protrusions 180, 182, 184, 186 may include lengths 180A, 182A, 184A, 186A, respectively.

In embodiments, certain wall sections of outer wall 132 may overlap with other wall sections. For example, and without limitation, third outer wall section 138 of terminal 130 may overlap fourth outer wall section 140 by a distance 150. In embodiments, an overlapping distance 150 of overlapping wall sections may be greater than the width of a protrusion (e.g., protrusions 186 of the terminal 130 and/or overlapping wall sections may overlap such that an exterior overlapping wall section (e.g., section 138) overlaps the entire width of the protrusion (e.g., the width of protrusions 186).

In embodiments, outer wall 132 may include one or more recesses that may face outward (e.g., recesses 148A, 148B). For example, and without limitation, second outer wall section 136 of female terminal 130 may include recess 148A, fourth outer wall 140 may include recess 148B.

In embodiments, protrusions 180, 182, 184, 186 of female terminal 130 may extend into extend into first side 24 of circuit board 20 and beyond second side 26 of circuit board 20 such that portions 180B, 182B, 184B, 186B extend beyond second side 26. Additionally or alternatively, portions 180B', 182B', 184B', 186B' of protrusions of another female terminal 30' may extend beyond second side 26 of circuit board 20.

Figure 6:
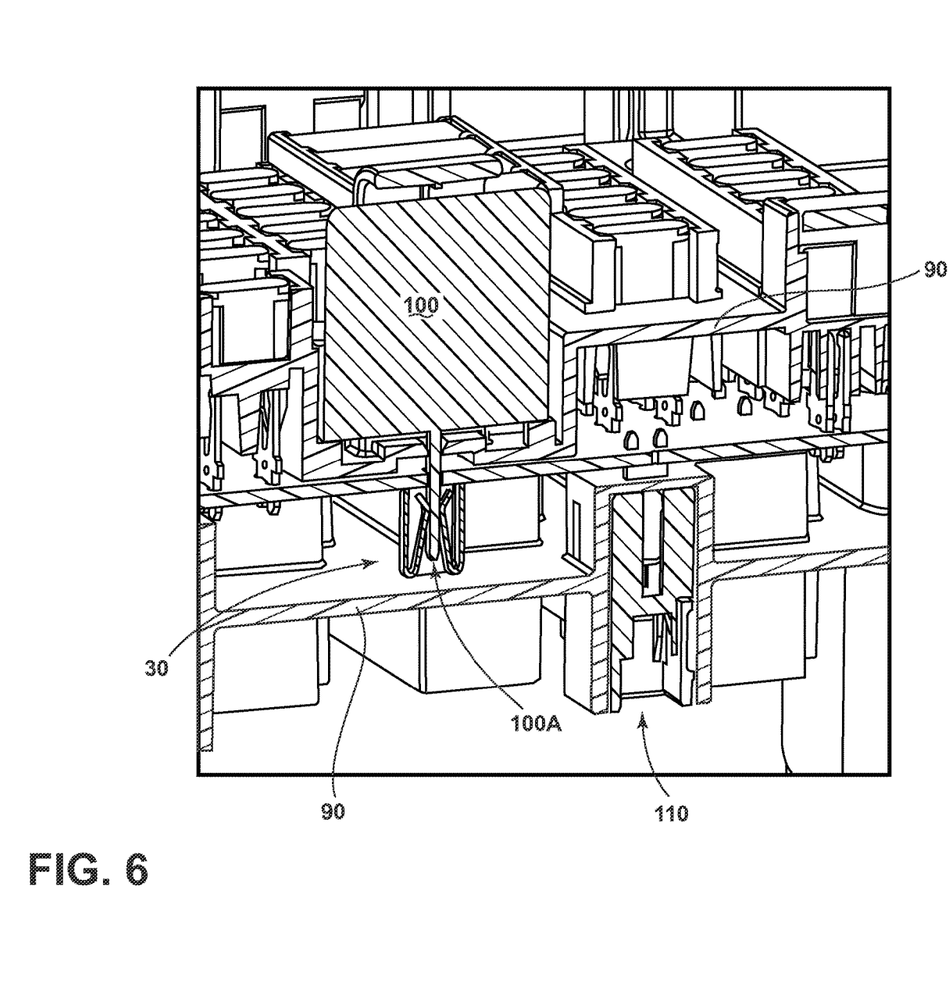
FIG. 6 is a cross-sectional perspective view of an embodiment of a circuit board assembly in accordance with teachings of the present disclosure.

In embodiments, such as generally illustrated in FIGS. 1 and 6, circuit board assembly 10 may include one or more electrical components 100, 102. Electrical components 100, 102 may include one or more of a variety of shapes, sizes, and/or configurations. In embodiments, electrical components 100, 102 may include one or more of fuses (e.g., maxi fuses), relays, and/or other electrical components. In embodiments, electrical components 100, 102 may include one or more male terminals 100A, 102A that may be configured to be received by a corresponding female terminal 30, 130. In embodiments, male terminal 100A of electrical component 100 may be wider and/or longer than male terminal 102A of electrical component 102. For example, and without limitation, male terminal 100A may be at least 1.5 times as wide and/or at least 1.5 times as long as male terminal 102A of a second electrical component 102. In embodiments, the height 32A of the outer wall 32 and/or the width 36A of second outer wall section 36 (or width 40A of fourth outer wall section 40) of a female terminal 30 may correspond to the length and/or width of a corresponding male terminal 100A. For example, terminal 30 may correspond to male terminal 100A and the height 32A of outer wall 32 may be at least 1.5 times greater than the height 132A of outer wall 132 of terminal 130, which may correspond to male terminal 102A. Additionally or alternatively, widths 36A, 40A of outer wall sections 36, 40 of terminal 30 may be at least 1.5 times wider than widths 136A, 140A of outer wall sections 136, 140 of terminal 130. In embodiments, width 34A, 38A of outer wall sections of terminal 30 may be at least 1.5 times wider than the widths 134A, 138A of outer wall section 134, 138 of terminal 130.

In embodiments, such as generally illustrated in FIGS. 1 and 6, circuit board assembly 10 may include a support structure/housing 90. Support structure 90 may be configured to physically support one or more electrical components 100, 102 and/or connector 110 relative to circuit board 20. In embodiments, support structure 90 may help align electrical components 100, 102 with circuit board 20 and/or may protect circuit board 20 from damage. For example, and without limitation, support structure 90 may include a thickness 90A of at least 1.5 mm. Support structure 90 may include one or more recesses $92_N$ (e.g., $92_1$, $92_2$) that may correspond to electrical components 100, 102 and/or may be configured to receive at least a portion of an electrical component 100, 102. In embodiments, a recess $92_N$ may include an aperture $94_N$ that may correspond to a male terminal 100A of electrical component 100 disposed in the recess $92_N$. For example, and without limitation, electrical component 100 may be inserted into recess $92_1$ such that male terminal 100A extends through aperture $94_1$ and into circuit board 20. In embodiments, portions of support structure 90 may be disposed at distance from circuit board 20 (e.g., there may be an air gap between support structure 90 and circuit board 20). For example, and without limitation, portions of support structure 90 disposed between electrical components 100, 102 and circuit board 20 may be disposed at a distance 96 from circuit board 20 and/or portions of support structure 90 between connector 110 and circuit board 20 may be disposed at a distance 98 from circuit board 20. Disposing portions of support structure 90 at a distance from circuit board 20 may allow for better thermal performance, such as better cooling (e.g., relative to configurations in which support structure 90 may be disposed directly on top of circuit board 20 in all areas).

In embodiments, such as generally illustrated in FIGS. 1 and 6, circuit board assembly 10 may include a connector 110 that may be configured to provide an electrical connection between circuit board 20 and a remote component 120 (e.g., a controller), such as via a wire 122. Connector 110 may include a height 112 that may be greater than the height 32A of outer wall 32 of female terminals 30 and/or greater than height 132A of outer wall 132 of terminal 130. In such configurations, an overall height 12 of circuit board assembly 10 may be independent of (e.g., may not be affected by) a maximum of height 32A of outer walls 32 and independent of a maximum of heights 80A, 82A, 84A, 86A of protrusions 80, 82, 84, 86. For example and without limitation, an overall height 12 of circuit board assembly 10 may include the sum of (i) a maximum of the height(s) 100B, 102B of electrical components 100, 102, (ii) a maximum of distance 96 of portions of support structure 90 that may be disposed between electrical components 100, 102 and circuit board 20 and/or distance 98 between connector 110 and circuit board 20, and (iii) a maximum of the height 112 of connector 110.

Figure 7:
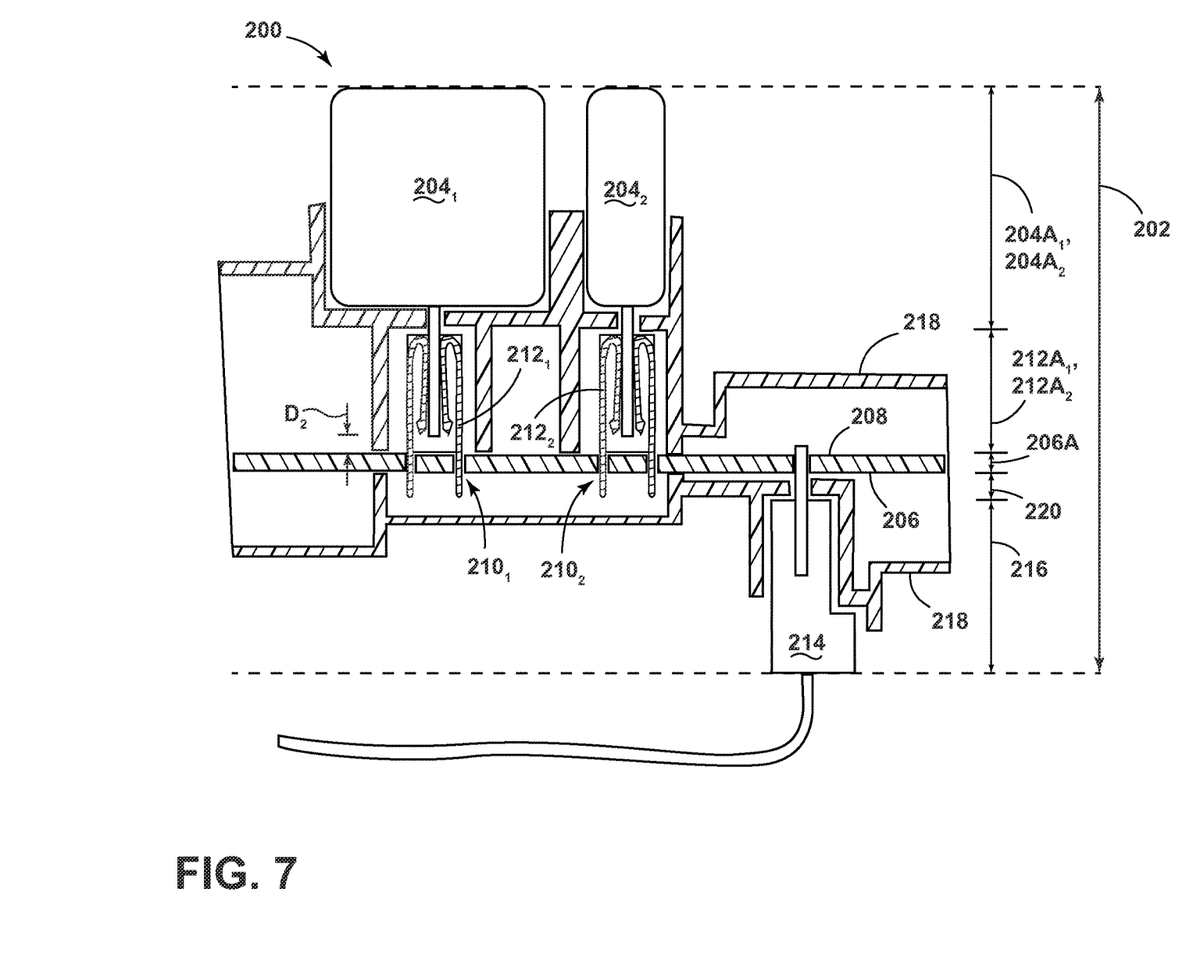
FIG. 7 is a cross-sectional view of an embodiment of a circuit board assembly in accordance with teachings of the present disclosure.

In examples of the present disclosure, embodiments of female terminals (e.g., female terminals $210_1$, $210_2$) may be arranged in a more conventional configuration, such as generally illustrated in connection with circuit board assembly 200 in FIG. 7. Circuit board assembly 200 may include electrical components $204_1$, $204_2$ that may be attached to circuit board 206 via female terminals $210_1$, $210_2$ and female terminals $210_1$, $210_2$ may be attached at the same side of the circuit board 206 as the electrical components $204_1$, $204_2$ (e.g., both attached at side 208). Such a configuration may result larger overall height 202 of the circuit board assembly 200 relative to circuit board assembly 10. For example, and without limitation, the overall height 202 of circuit board assembly 200 may include (i) the height $204A_1$, $204A_2$ of the electrical components $204_1$, $204_2$, (ii) the height $212A_1$, $212A_2$ of walls $212_1$, $212_2$ of the female terminals $210_1$, $210_2$, (iii) the height 220 of support structure 218 between the circuit board 206 and a connector 214, (iv) the thickness 206A of circuit board 206, and (v) the height 216 of a connector 214. In contrast, in embodiments of the present disclosure, an overall height 12 of circuit board assembly 10 may effectively be independent of (e.g., may not be affected by) the heights 32A, 132A of walls 32, 132 of female terminals 30, 130, such as generally illustrated in FIG. 1 (e.g., overall height 202 may be greater than overall height 12).

Figure 8:
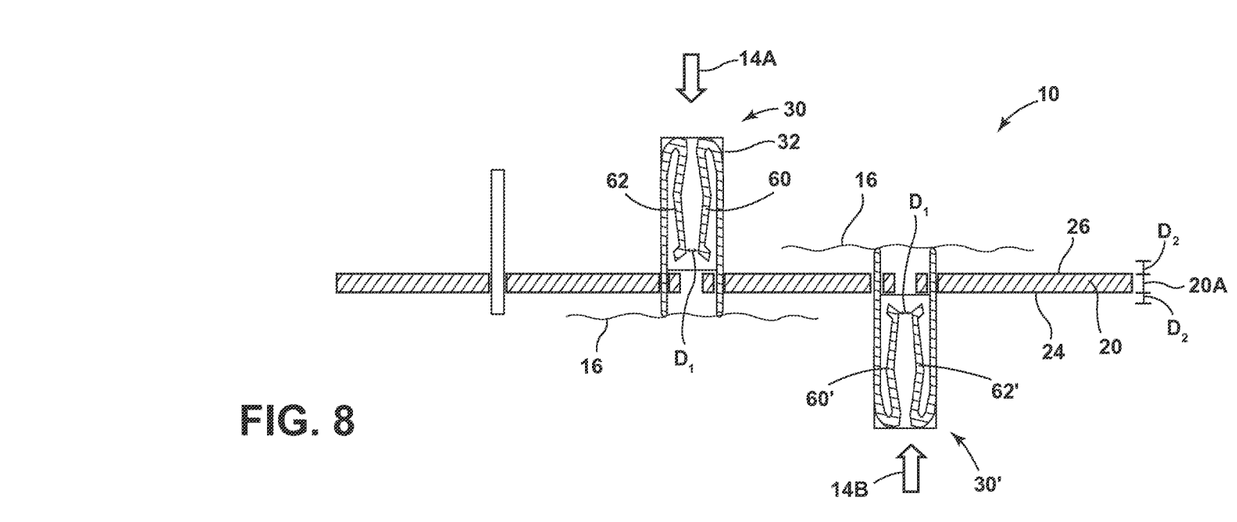
FIG. 8 is a cross-sectional view of an embodiment of a circuit board assembly in accordance with teachings of the present disclosure.

In embodiments, such as generally illustrated in FIG. 8, a method of manufacturing a circuit board assembly 10 may include providing a circuit board 20. One or more female terminals 30, 30' (and/or terminals 130, 130') may then be connected to and/or inserted into circuit board 20 (e.g., in directions 14A, 14B). In embodiments, inserting one or more female terminals into circuit board 20 may not include outer wall 32 or any prongs passing through a hole in circuit board 20 (e.g., embodiments of female terminals 30, 30', 130, 130' may be completely formed, folded, and/or assembled prior to insertion into circuit board 20). Once connected/inserted, a female terminals 30, 30' may be disposed such that prongs 60, 62 and 60', 62' (and/or prongs 64, 66) are disposed at a distance $D_2$ from surfaces 26, 24, respectively, of circuit board 20. Distance $D_2$ may be configured such that during soldering, such as reflow and/or wave soldering, solder 16 does not affect or materially affect the insertion of a male terminal (e.g., 100A) into female terminal 30. For example, and without limitation, solder 16 may be applied to circuit board surface 24, and prongs 60, 62 may be disposed such that they are separated from the solder 16 by the thickness 20A of circuit board 20 and distance $D_2$. Such separation may eliminate and/or reduce the amount of solder 16 that reaches prongs 60, 62 during soldering and such solder 16 might otherwise attach to prongs 60, 62 and impair or prevent insertion of a male terminal 100A. Distance $D_2$ may, for example and without limitation, be about one tenth of the height 32A of outer wall 32.

Figure 9:
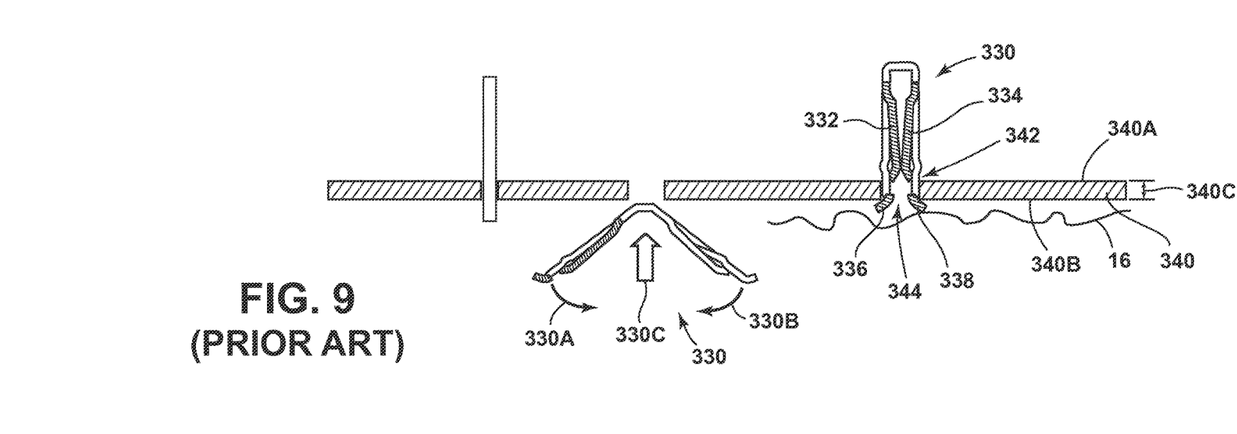
FIG. 9 is a cross-sectional view of a female terminal configuration.

In contrast, some female terminals (e.g., terminal 330), such as generally illustrated in FIG. 9, include prongs 332, 334 and may be inserted (e.g., such as indicated via arrows 330A, 330B, 330C) such that prongs 332, 334 are disposed even with and/or in contact with the a top surface 340A of a circuit board 340 and are only separated from the underside 340B of the circuit board (and any solder 16 applied thereto) by the thickness 340C of circuit board 340. While such a relatively small separation may not be a significant issue for wave soldering, the small separation may permit solder 16, during reflow soldering, to reach and attach to prongs 332, 334, which may impair or prevent insertion of a male terminal 100A. Similarly, legs 336, 338 of terminal 330 may extend through a single aperture 342 in circuit board 340 and define a smaller aperture 344 through circuit board 340 into which a male terminal 100A is intended to be inserted (e.g., legs 336, 338 and male terminal 100A would all effectively extend through the same aperture 342 in circuit board 340). Applying solder 16 via reflow soldering to an underside 340B of circuit board may not be practical as solder 16 may attach to legs 336, 338 and prevent insertion of a male terminal 100A. In contrast, with respect to female terminal 30, a male terminal 100A may extend into an aperture (e.g., aperture $22_1$, $22_2$, $22_3$, or $22_4$) of circuit board 20 and protrusions 80-86 of female terminal 30 may extend through protrusion apertures (e.g., apertures $28_1$, $28_2$, $28_3$, $28_4$) that are separate and distinct from apertures $22_1$, $22_2$, $22_3$, $22_4$ (see, e.g., FIG. 5B). Such a configuration/separation of protrusions 80-86 relative to aperture $22_1$ may allow for solder 16 to attach to protrusions 80-86 to secure female terminal 30 to circuit board 20 without interfering with insertion of a male terminal 100A.

In some configurations, prongs 332, 334 may be disposed such that they are in contact with each other prior to insertion of a male terminal 100A. However, such a configuration of prongs 332, 334 may allow for solder 16, during reflow soldering, to effectively bond prongs 332, 334 together and prevent subsequent insertion of a male terminal 100A. In contrast, prongs (e.g., prongs 60, 62, 64, 66) of female terminals (e.g., 30, 130) of the present disclosure may be disposed a minimum distance $D_1$ apart from each other, which may correspond to a thickness of a corresponding male terminal (e.g., male terminals 100A, 102A). Such a separation may prevent solder 16 that may otherwise reach prongs 60, 62 during reflow soldering from bonding prongs 60, 62 together and/or may allow for reflow and/or wave soldering. At least reflow soldering may not be compatible with some designs.

Figure 10:
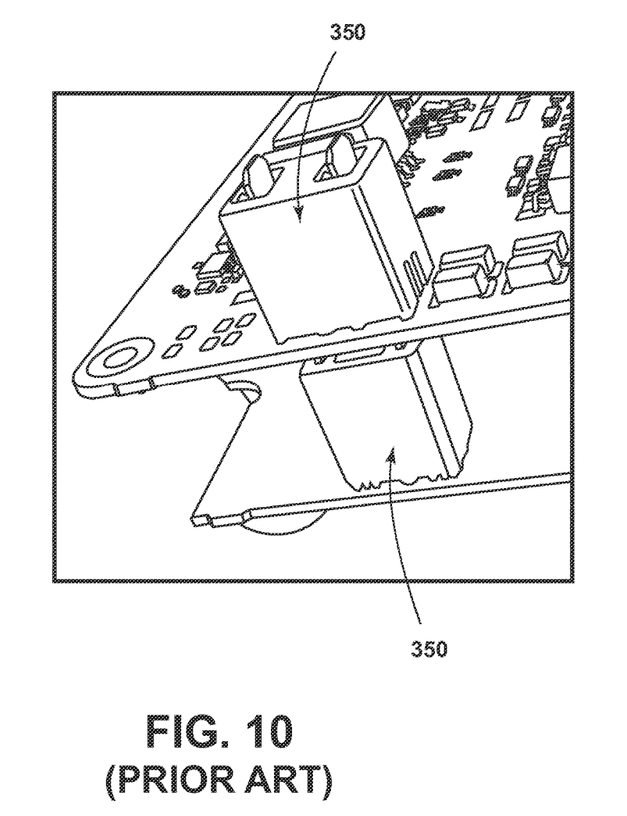
FIGS. 10 and 11 are perspective views of female terminal configurations with plastic casings.
Figure 11:
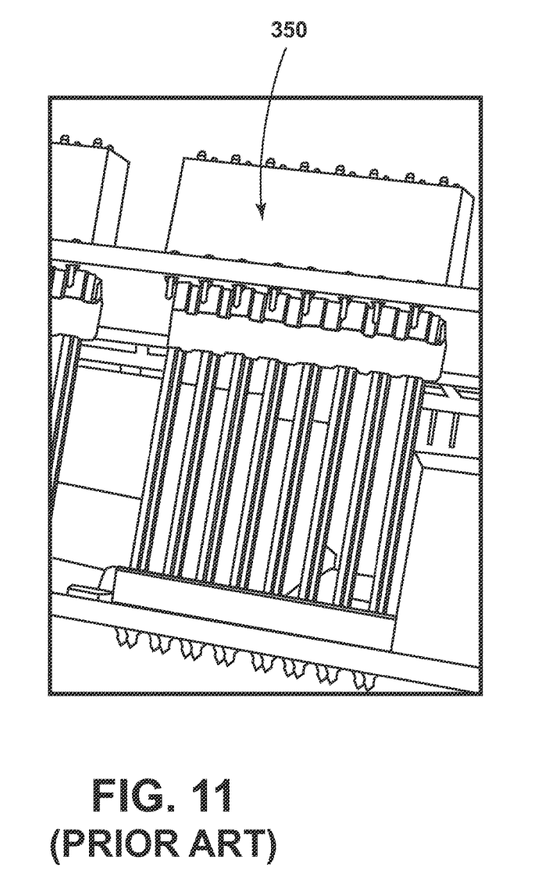

In some configurations, such as generally illustrated in FIGS. 10 and 11, it may be necessary to use a plastic casing 350 to insert a terminal into a circuit board. However, the plastic casing may then need to be configured to withstand a soldering process, which may cause the plastic casing to be more expensive and/or require the use of a more expensive soldering process. A plastic casing may also increase the overall height of the some circuit board assemblies. A plastic casing may also require that the terminal be distributed in blister packaging as opposed to reel packaging, which may be more expensive. In embodiments of the present disclosure, female terminals (e.g., terminals 30, 30', 130, 130'), may be used without such a plastic casing, which may reduce the complexity, weight, and/or cost of female terminals and/or circuit board assemblies of the present disclosure.

In embodiments of the present disclosure, after one or more female terminals (e.g., terminals 30, 30', 130, 130') have been inserted, the one or more terminals may be soldered to circuit board 20, such as via reflow soldering, wave soldering, and/or selective-wave soldering. One or more electrical components 100, 102 may then be inserted into circuit board 20 (e.g., an opposite side of circuit board 20 than the one or more female terminals) such that male terminals 100A, 102A of the electrical components 100, 102 may extend through support structure 90 and/or circuit board 20 and into a corresponding female terminal 30, 130 (see, e.g., FIG. 1). In embodiments, one or more female terminals (e.g., terminals 30, 30') may be disposed on and/or attached to a first side of circuit board 20 and electrical components 100, 102 may be disposed on and/or attached to a second side of circuit board 20 opposite the first side. In embodiments, a male terminal 100A of an electrical component 100 may extend (i) into in recess $92_1$, (ii) aperture $94_1$, (iii) between portions 80B, 82B, 84B, 86B of protrusions 80, 82, 84, 86 of corresponding female terminal 30 that extend above second side 26 of circuit board 20, (iv) through an aperture $22_1$ in circuit board 20 that may be disposed between protrusions (e.g., 80, 82, 84, 86) of the corresponding female terminal 30, and/or (v) between two or more prongs (e.g., 60, 62) of the corresponding female terminal 30. In embodiments, a male terminal 100A may not extend all of the way through female terminal 30 (e.g., may not extend beyond bottom 46 of outer wall 32). While the above method has been described largely in connection with female terminal 30, the method may be used in connection with other embodiments of a female terminal, including, without limitation, female terminals 30', 130, 130'.

In embodiments, such as generally illustrated in FIG. 8, one or more female terminals 30, 130 may be inserted into second side 26 of circuit board 20 such that at least one female terminal 30, 130 is disposed on both sides 24, 26 of circuit board 20.

Various embodiments are described herein to various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "some embodiments," "one embodiment," or "an embodiment," or the like, means that a particular feature, structure, or characteristic described in connection with the embodiment is included in at least one embodiment. Thus, appearances of the phrases "in various embodiments," "in some embodiments," "in one embodiment," or "in an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features, structures, or characteristics of one or more other embodiments without limitation given that such combination is not illogical or non-functional.

Although only certain embodiments have been described above with a certain degree of particularity, those skilled in the art could make numerous alterations to the disclosed embodiments without departing from the scope of this disclosure. Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." throughout the specification is to be construed broadly and is used to provide non-limiting examples of embodiments of the disclosure, and the disclosure is not limited to such examples. The use of "vertical" and "horizontal" are provide for reference and it is specifically contemplated that embodiments of the present disclosure may be disposed at various angles. It is intended that all matter contained in the above description or shown in the accompanying drawings shall be interpreted as illustrative only and not limiting. Changes in detail or structure may be made without departing from the present disclosure as defined in the appended claims.

What is claimed is:

1. A circuit board assembly, comprising:
   a circuit board including a first side and a second side opposite from the first side;
   a female terminal inserted in the first side of the circuit board, the female terminal including an outer wall and a plurality of prongs extending from the outer wall in an upward direction toward a top of the outer wall; and
   an electrical component including a male terminal inserted in the second side of the circuit board and extending through the circuit board into the female terminal;
   wherein the outer wall is an interlocking outer wall defining an internal space; and the plurality of prongs are disposed substantially within the internal space and at a vertical distance from the top of the outer wall.

2. The circuit board assembly of claim 1, wherein the female terminal includes a plurality of protrusions extending vertically from the top of the outer wall of the female terminal into respective protrusion apertures of the circuit board; and, the male terminal extends into an aperture separate from the protrusion apertures and extends between the plurality of protrusions.

3. The circuit board assembly of claim 1, wherein each of the plurality of prongs comprises:
   a first portion extending from a bottom of the outer wall;
   a second portion disposed in the internal space and extending generally toward the first side of the circuit board; and
   a curved portion connecting the first portion and the second portion.

4. The circuit board assembly of claim 1, wherein the plurality of prongs are each disposed at a distance from the circuit board, and the plurality of prongs includes a first pair of prongs and a second pair of prongs.

5. The circuit board assembly of claim 1, wherein the the plurality of prongs includes a prong having a bent portion that bends outward toward the outer wall of the female terminal.

6. An electrical device comprising:
   the circuit board assembly of claim 1; and a housing in which the circuit board assembly is contained;
wherein the male terminal extends through an aperture in the housing.

7. The circuit board assembly of claim 1, wherein the outer wall is configured such that with insertion of the female terminal into the circuit board, the top of the outer wall is adjacent to the circuit board and the plurality of prongs are vertically offset from the circuit board by the vertical distance.

8. The circuit board assembly of claim 1, wherein the plurality of prongs extend from a bottom of the outer wall and curve to extend into the internal space; and each prong of the plurality of prongs includes a bent portion that bends outward toward the outer wall and includes a bent end.

9. A female electrical terminal, comprising: an outer wall defining an internal space, the outer wall including a top and including a bottom; and a pair of prongs extending from the outer wall in an upward direction toward the top of the outer wall, the pair of prongs extending at least partially within the internal space; wherein an end of each prong of the pair of prongs is disposed at a vertical distance from the top of the outer wall; wherein the outer wall includes an overlapping section.

10. The female electrical terminal of claim 9, wherein the outer wall is configured such that with insertion of the female electrical terminal into a circuit board, the top of the outer wall is adjacent to the circuit board and the pair of prongs are vertically offset from the circuit board by the vertical distance.

11. The female electrical terminal of claim 9, wherein the pair of prongs extend from a bottom of the outer wall and curve to extend into the internal space; and each prong of the pair of prongs includes a bent portion that bends outward toward the outer wall and includes a bent end.

12. The female electrical terminal of claim 9, including a plurality of protrusions extending vertically from the top of the outer wall and configured to extend into respective protrusion apertures of a circuit board.

13. The female electrical terminal of claim 9, wherein each prong of the pair of prongs comprises:
a first portion extending from a bottom of the outer wall;
a second portion disposed in the internal space; and
a curved portion connecting the first portion and the second portion.

14. The female electrical terminal of claim 9, including a second pair of prongs; wherein the second pair of prongs is disposed at the vertical distance from the top of the outer wall.

15. The female electrical terminal of claim 9, wherein the pair of prongs includes a prong having a bent portion that bends outward toward the outer wall.

16. A female electrical terminal, comprising: an outer wall defining an internal space, the outer wall including a top and including a bottom;
a first pair of prongs extending from the outer wall in an upward direction toward the top of the outer wall, the first pair of prongs extending at least partially within the internal space; and
a second pair of prongs;
wherein an end of each prong of the first pair of prongs is disposed at a vertical distance from the top of the outer wall; the first pair of prongs are horizontally separated from each other, are biased toward each other, and are configured to retain a male terminal of a corresponding electrical component; the first pair of prongs includes a first prong and a second prong; the second pair of prongs includes a third prong and a fourth prong curved sections of the first prong and the third prong are formed as a single piece; and curved sections of the second prong and the fourth prong are formed as a single piece.

17. The female electrical terminal of claim 16, wherein the outer wall is interlocking.

18. The female electrical terminal of claim 16, wherein the outer wall includes an overlapping section.

19. The female electrical terminal of claim 16, wherein at least one of the first prong, the second prong, the third prong, and the fourth prong includes a bent portion that bends outward toward the outer wall.

20. The female electrical terminal of claim 16, including a plurality of protrusions extending vertically from the top of the outer wall and configured to extend into respective protrusion apertures of a circuit board.

\* \* \* \* \*